(12) United States Patent
Evertsen et al.

(10) Patent No.: US 7,682,937 B2
(45) Date of Patent: Mar. 23, 2010

(54) METHOD OF TREATING A SUBSTRATE, METHOD OF PROCESSING A SUBSTRATE USING A LASER BEAM, AND ARRANGEMENT

(75) Inventors: Rogier Evertsen, Nijmegen (NL); Hans Peter Chall, Molenhoek (NL)

(73) Assignee: Advanced Laser Separation International B.V., Beuningen (NL)

( * ) Notice: Subject to any disclaimer, the term of this patent is extended or adjusted under 35 U.S.C. 154(b) by 148 days.

(21) Appl. No.: 11/286,432

(22) Filed: Nov. 25, 2005

(65) Prior Publication Data
US 2007/0123061 A1 May 31, 2007

(51) Int. Cl.
*H01L 21/20* (2006.01)
(52) U.S. Cl. ........................ 438/462; 438/463; 438/464; 438/691; 438/693; 438/718; 257/E21.211; 257/E21.218; 257/E21.238; 257/E21.599
(58) Field of Classification Search ................ 438/487, 438/662, 940, 707–708, 712, 462–467, 691–693, 438/714–719; 257/E23.148, E23.15, E21.028, 257/E21.134, E21.347, E21.475, E21.49, 257/E21.228, 347, 475, 576, 578, 579, 597, 257/E23.146, E21.211, 218, 238, 599
See application file for complete search history.

(56) References Cited

U.S. PATENT DOCUMENTS

| | | | | |
|---|---|---|---|---|
| 3,866,398 A * | 2/1975 | Vernon et al. ................ 134/1.3 |
| 4,522,656 A * | 6/1985 | Kuhn-Kuhnenfeld et al. .... 219/121.66 |
| 4,729,971 A * | 3/1988 | Coleman ..................... 438/462 |
| 5,254,833 A * | 10/1993 | Okiyama ................ 219/121.68 |
| 5,493,096 A * | 2/1996 | Koh ........................ 219/121.71 |
| 5,610,104 A * | 3/1997 | Mitchell ..................... 428/428 |
| 5,641,416 A * | 6/1997 | Chadha .................. 219/121.69 |
| 5,855,735 A * | 1/1999 | Takada et al. ............... 438/691 |
| 5,872,046 A * | 2/1999 | Kaeriyama et al. .......... 438/465 |
| 6,063,695 A * | 5/2000 | Lin et al. ..................... 438/462 |
| 6,117,347 A * | 9/2000 | Ishida ......................... 216/52 |
| 6,300,251 B1 * | 10/2001 | Pradeep et al. .............. 438/710 |
| 6,316,350 B1 * | 11/2001 | Eissa et al. .................. 438/637 |
| 6,335,559 B1 * | 1/2002 | Charles ...................... 257/620 |
| 6,602,762 B2 * | 8/2003 | Hwan et al. ................. 438/460 |
| 6,784,112 B2 * | 8/2004 | Arita et al. .................. 438/714 |
| 6,803,247 B2 * | 10/2004 | Sekiya ........................ 438/33 |
| 6,849,524 B2 * | 2/2005 | Shelton et al. .............. 438/465 |
| 7,057,133 B2 * | 6/2006 | Lei et al. ................ 219/121.71 |
| 7,129,114 B2 * | 10/2006 | Akram ....................... 438/110 |
| 7,173,212 B1 * | 2/2007 | Semak ................... 219/121.69 |
| 7,265,032 B2 * | 9/2007 | Sharan et al. ............... 438/460 |
| 7,364,985 B2 * | 4/2008 | Kirby ......................... 438/463 |
| 7,514,291 B2 * | 4/2009 | Akram ....................... 438/110 |
| 2002/0127824 A1* | 9/2002 | Shelton et al. .............. 438/463 |
| 2005/0109369 A1* | 5/2005 | Reder et al. .................... 134/1 |

* cited by examiner

*Primary Examiner*—Michael S Lebentritt
(74) *Attorney, Agent, or Firm*—Oblon, Spivak, McClelland, Maier & Neustadt, L.L.P.

(57) ABSTRACT

A method and arrangement for treating a substrate processed using a laser beam, wherein said substrate comprises at least a body of semiconductor material. The method comprises a step of etching said substrate for removing from said body of semiconductor material recast material deposited on said body during said laser processing. The step of etching is controlled for removing in addition to said recast layer, at least a part of said semiconductor material of said body for improving mechanical strength of said substrate.

24 Claims, 4 Drawing Sheets

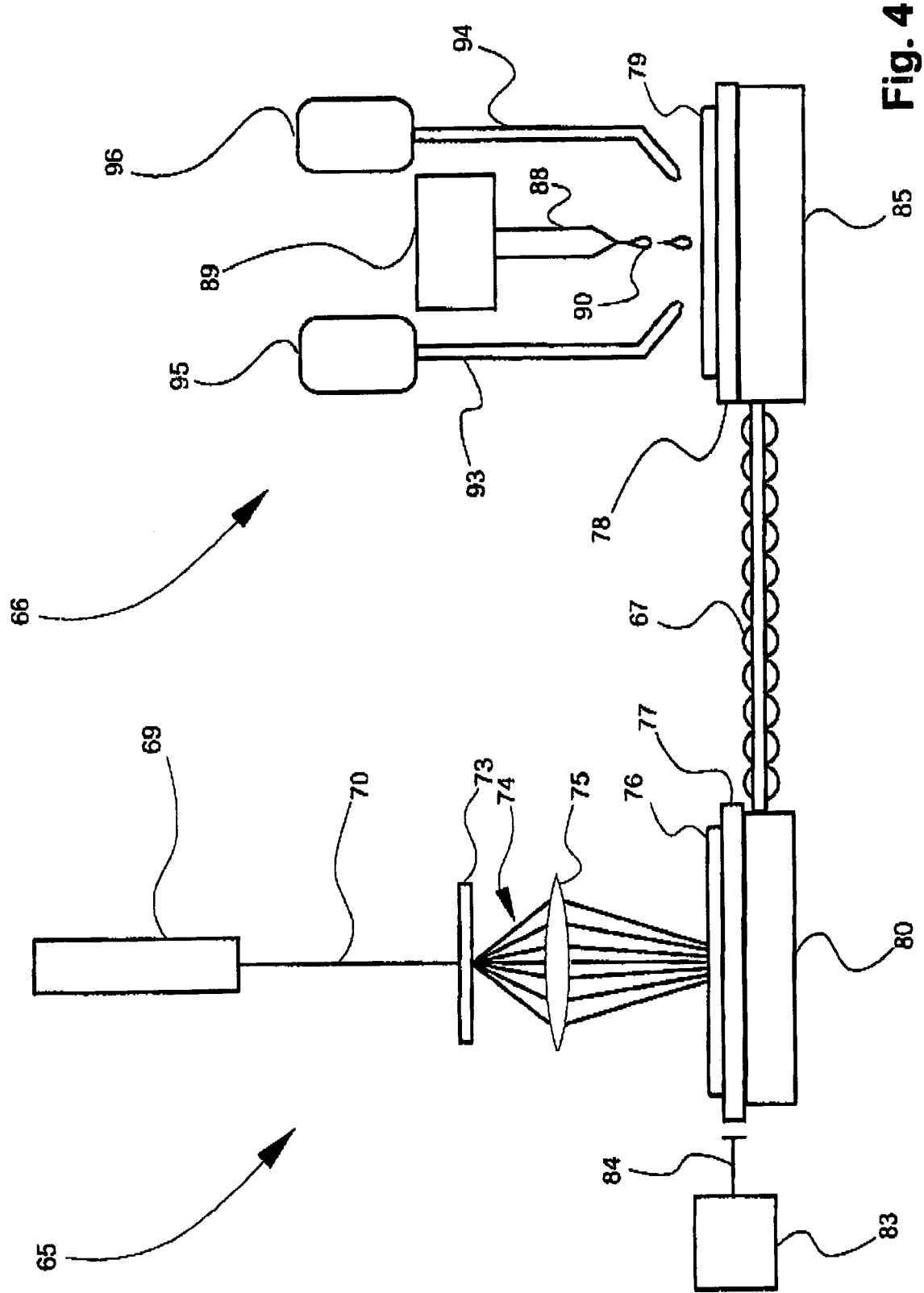

METHOD OF TREATING A SUBSTRATE, METHOD OF PROCESSING A SUBSTRATE USING A LASER BEAM, AND ARRANGEMENT

FIELD OF THE INVENTION

The present invention relates generally to a method of treating a substrate processed using a laser beam, and in particular to a method of treating a substrate processed using a laser beam, said substrate comprising at least a body of semiconductor material, said method comprising a step of etching said substrate for removing from said body of semiconductor material recast material deposited on said body during said laser processing.

The invention further relates to a method of processing a substrate using a laser beam comprising a treatment method as described above.

In addition, the present invention relates to a semiconductor element manufactured using any of the abovementioned methods.

BACKGROUND ART

A method as described above is for example disclosed in United States Patent application number US 2002/0127824, by Shelton et. al., disclosing the removal of slag from semiconductor elements separated from a wafer using a laser dicing method. The document concentrates on the removal of slag from devices which are manufactured by separating them from a wafer, using a laser ablation scribing process for forming scribing lines followed by a step of breaking the wafer along these scribing lines. In particular, the slag is removed from the wafer after scribing, since the presence of slag may degrade the reliability of devices and inhibits wire bonding. Also, the slag can absorb some of the optical output power output of LED's.

As described in the above mentioned document, said slag is removed from said semiconductor elements by applying a protective coating, mounting the wafer on a mounting material (such as an adhesive tape), and after cutting the wafer using a laser beam, applying either a wet or a dry etch process for removing the protective coating and said slag, without affecting the mounting material.

A disadvantage of the above and other prior art methods used for separating semiconductor elements, is that it has been experienced that laser dicing of wafers results in a weaker die-strength of the single die. Especially for thin wafers, this is a critical issue. The reduced die-strength is experienced as an increased change of fracture, which can be encountered during die-handling, such as, for example, in the assembly of the die into IC-packages, e.g. die- and wire-bonding. It is noted therefore, that the above mentioned method of removing slag from a wafer during the separation process, does not effectively resolve the problems experienced with wire bonding. The reduced die-strength due to laser induced defects can be measured by a test method consisting of mechanical bending the dies in a special arrangement using four- and three-point measurements designed to focus on edge defects.

The above problem implies that handling of the product after separation is limited. It is noted for example that, in order to increase throughput, many laser dicing processes of prior art make use of cleaning methods such as high pressure cleaning. Normal cleaning methods such as high pressure cleaning cannot be applied, or are not effective in the range which can be applied, leaving debris behind on the singulated die surface. It is in particular noted that high pressure cleaning methods, where the die strength of devices is reduced as a result of the laser dicing process, may damage sensible surface structures on the device, such as vias. The debris left on the device as a result of ineffective cleaning, again causes problems such as reduced service life and degradation of reliability of the device, or decreased output power of e.g. LED's, etcetera.

SUMMARY OF THE INVENTION

It is an object of the invention to provide a method treating semiconductor elements and other semiconductor substrates that have been subjected to laser processing, which methods alleviates the problems and disadvantages described above, providing semiconductor elements and substrates with optimal die strength, that are less sensible to damaging during handling thereof.

These and other objects are achieved by the present invention, in that there is provided a method of treating a substrate processed using a laser beam, said substrate comprising at least a body of semiconductor material, said method comprising a step of etching said substrate for removing from said body of semiconductor material recast material deposited on said body during said laser processing, characterized in that said step of etching is controlled for removing at least a part of said semiconductor material of said body for improving mechanical strength of said substrate.

The inventors of the present invention have discovered that the reduced die-strength is the result of microcracks formed at the interface between the recast layer of slag and the base material (the semiconductor material of the body) of the die. Differences exist between the densities and structural arrangement of the recast layer and the base material. For example, upon re-solidification, the recast material expands during the cooling down, creating a difference in density and inducing stress in the recast layer which may cause these microcracks and/or other defects. These micro-cracks extend into the base material and, like other defects such as, for example, sharp tips, are sources for crack initiation and propagation. An increased amount of defects reduces the die strength and increases the chance of fracture.

This is resolved by removing at least a part of the base material or semiconductor material of said body of the substrate, since the microcracks are mainly present in the base semiconductor material, near the interface between the semiconductor material of the body and the recast layer (slag). An additional advantage is that other defects (such as sharp tips) in the semiconductor material of the body are also removed. The method thereby provides controlled removal of crack initiator defects in the body of the substrate. This reduces the chance of crack propagation, and as a result, reduces the risk of fracture of the substrate or device after processing, e.g. during handling. As a result, the die strength of such devices and substrates after processing is substantially improved, improving their functionality, service life, reliability and visual appearance.

The microcracks resulting from the laser processing, may be considered collateral damage from the laser processing method. As described above microcracks mainly extend into the semiconductor material near the interface with the recast layer formed during laser processing, leaving the body of the substrate thereby at least partly damaged. According to an embodiment of the invention, said semiconductor material of said body is at least partly damaged by said laser processing as described above, and said step of etching is controlled for removing at least said damaged part of said body of semiconductor material. It will be appreciated that the process may be optimized by removing just sufficiently the semiconductor material of the body over a depth extending into the body wherein said microcracks are mainly contained. Removing too much semiconductor material may deteriorate functionality of the devices, while the die strength may only be improved marginally if insufficient material is removed. The depth over which the microcracks extend into the base material of the body will depend on processing parameters of the laser processing method and on the specific choice of semiconductor material. It is noted, that the improvement in die strength may be analysed using e.g. fractography analysis and Weibull statistics to determine the characteristic strength and the Weibull parameter.

In view of the above, according to an embodiment of the invention, said substrate comprises a score or cut formed during said laser processing, and wherein said etching is controlled for removing at least a part of said semiconductor material contiguous to said score or cut. As explained above, most of the collateral laser damage in the form of microcracks may be expected in this part of the body of the substrate. Said step of etching, according to an embodiment, is controlled for removing semiconductor material within a range of at most 10 μm from an exterior surface of said body, as measured prior to said etching. Forming of microcracks mainly takes place within this range of depth into the body, extending from the interface between the recast layer and the body. For a silicon wafer and using focussed ion beam imaging (FIB), the inventors have discovered that some microcracks can run up to 7 μm through the recast layer and into the material. Analysis with a transmission electron microscope shows in this case that the thickness of the recast layer is about 3 to 4 μm. It should be noted that the problem of die strength deterioration is not confined to microcracks of the dimensions indicated above, but already a very small microcrack of 1 μm or less are sufficient to reduce the die strength.

As will be appreciated, and in accordance with an embodiment, said step of etching is controlled by performing said step of etching for a duration of time which is optimized for removing said recast material and said part of said semiconductor material. The required duration of the etching step will depend on a number of factors, amongst which in particular, the semiconductor material of the substrate and the etch composition used.

Different etch compositions can be used with the method of the present invention, said compositions being optimized for the specific process step under both alkaline and acidic conditions. For example, when the etch clean die-strength optimization is applied to a GaAs wafer with multiple layers such as silicon nitride ($Si_xN_y$, in any suitable ratio between x and y), epitaxial grown GaAs and AlGaAs ($Al_oGa_pAs_q$ in any suitable ratio between o, p and q), an alkaline etch such as the commonly known ammonia:hydrogenperoxide:water ($NH_4OH:H_2O_2:H_2O$) system can be used. For optimum die-strength recovery or improvement, the etch clean composition is optimized for the system. Optimized properties include, but are not limited to, compatibility with the semiconductor material of the substrate, selectivity, etch rates, underetching, and/or final morphology, for example, polished or textured. In addition, the occurrence of etch clean residual and/or adhesion on the substrate after said treatment is avoided. The etch composition used in the etching may be at least one member selected from a group comprising $NH_4OH$, $H_2O_2$, HCl, $H_3PO_4$, $HNO_3$, HF, NaOH, KOH, NaOCl, KOCl, $HClO_4$, $H_2SO_4$, $(CH_3)_4NOH$ (tetramethyl ammonium hydroxide (TMAH)), HBr, $K_2Cr_2O_7$, $C_5H_6O_7$, $HOOCCH_2CH_2COOH$ (succinic acid), $Br_2$, organic amines, such as $C_2H_8N_2$ (ethylene diamine) which is used with pyrocathechol (EDP), $NH_4F$, solvents $CH_3COOH$, $CH_3OH$, or compositions of the above such as $NH_4OH:H_2O_2:H_2O$, $H_3PO_4:H_2O_2:H_2O$, $HNO_3:HF:H_2O$.

For example, for a GaAs wafer with multiple layers such as siliconnitride, epitaxial grown GaAs and AlGaAs, the composition has been optimized to, but is not limited to, $NH_4OH:H_2O_2:H_2O$ as 1.6:25:75. The relative selectivity GaAs/AlGaAs has been optimized to be around 60 for the epitaxial grown GaAs and AlGaAs. The process window is chosen such that the slag or recast layer is removed completely and the semiconductor material of the body is also slightly etched such as to substantially or completely remove microcracks appearing therein. The underetching of the siliconnitride layer is under control and limited after the etch step of the present invention. Other etch compositions and parameter ranges, also for use with different semiconductors, are described hereinbelow.

According to another embodiment of the invention, said method further comprises a step of cleaning of said substrate for removing debris from said substrate. This may be performed using any prior art cleaning step, such as high pressure cleaning. It will be appreciated that because of the improved die strength, the application of prior art cleaning methods can be performed more effectively, e.g. using higher pressures, without damaging the substrate.

In accordance with an embodiment of the invention, however, said step of cleaning of said substrate is performed prior to said step of etching of said substrate. This may improve the results obtained with said etching step.

In accordance with yet another embodiment of the invention, said etching is controlled for removing the debris from said substrate. It will be appreciated that this would improve the throughput of substrates being treated using the method of the present invention, in that the recast layer, the debris, and the microcracks or collateral damage in the semiconductor material of the body of the substrate are removed in one method step.

The method may be applied to substrates comprising a protective coating. Applying a protective coating improves control over the etching step as it enables directing the etching composition only to those regions of the substrate having an interface with a recast layer. In particular, a protective coating may be applied to a substrate prior to laser processing thereof. By irradiating the substrate with the laser, a score or cut may be formed, and a recast layer will be deposited on the walls of the score. Part of the slag forming the recast laser will be deposited adjacent to the score, on top of the protective coating. The step of etching is controlled for removing said protective coating from said substrate. The thickness and material of protective coating may be chosen such that if etching is performed for a certain duration of time, the protective coating is removed together with any debris and slag on top of it, whilst at the same time, the recast layer in the score or cut and a small part of the semiconductor material of the body of the substrate containing the collateral damage is removed.

The method may be applied to a range of laser processing methods. According to the invention, said processing of said substrate prior to said treating of said substrate comprises at least one of a group comprising scribing of said substrate, laser cutting or laser dicing of said substrate, or forming of said substrate using a laser cutting or laser dicing process.

In addition, the method of the invention may be applied in manufacturing processes for all kinds of semiconductor elements and components. Therefore, according to the invention, said substrate is selected from a group comprising a wafer, a semiconductor element separated from a wafer, such as an integrated circuit, a diode, a transistor, or an operational amplifier.

According to a second aspect, the invention is directed to a method of processing a substrate using a laser beam comprising a treatment method as described above, wherein said substrate comprises at least a body of semiconductor material, and wherein said method comprises a step of etching said substrate for removing from said body of semiconductor material recast material deposited on said body during said laser processing, characterized in that said step of etching is controlled for removing at least a part of said semiconductor material of said body for improving mechanical strength of said substrate.

In accordance with an embodiment of this second aspect, prior to said step of processing said substrate, said substrate is mounted on an adhesive tape. This tape may be mounted on a frame. The etching composition used during the step of etching is applicable with the tapes and the frames used. The composition and process properties are chosen such that the tape and frame properties are not adversely affected and damage to the tape and frame does not occur.

According to a third aspect, the invention is related to an arrangement for performing any method as described above, comprising means for providing a laser beam for processing a substrate of semiconductor material, and means for etching said substrate after processing thereof with said laser beam, wherein said means for etching are arranged for controlling said etching for removing recast material from said substrate and for removing at least a part of said semiconductor material of said substrate.

BRIEF DESCRIPTION OF THE DRAWINGS

The present invention will now further be elucidated by a description and drawings referring to a preferred embodiment thereof, directed to the cutting of a wafer using a laser ablation, for separating semiconductor elements therefrom. The invention is not limited to the embodiments disclosed, which are provided for explanatory purposes only.

FIG. 1B shows a cross sectional wafer after the laser ablation method of FIG. 1a;

FIG. 4 schematically illustrates an arrangement for performing the method of the present invention.

DETAILED DESCRIPTION OF THE DRAWINGS

Figure 1A:
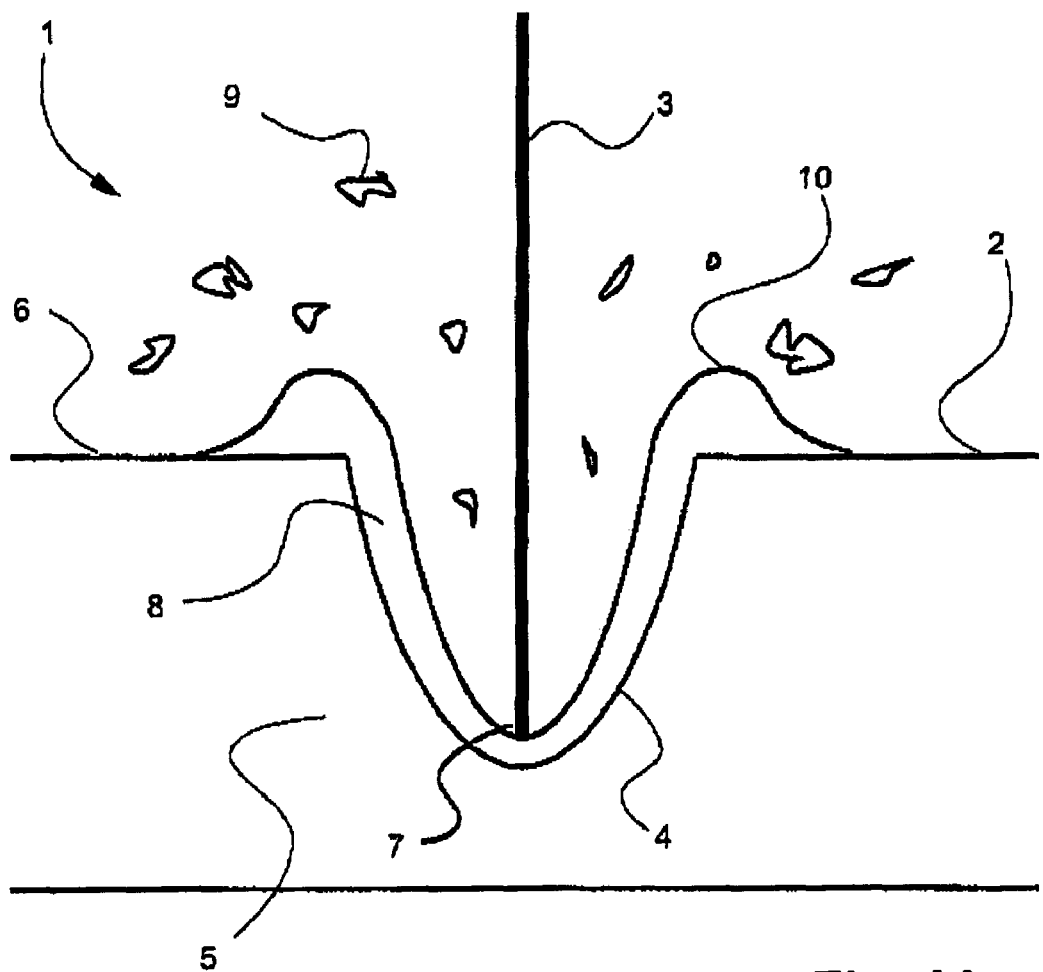
FIG. 1A is a schematic drawing of the forming of a score in a wafer using a prior art laser ablation method.

In FIG. 1A, a prior art laser ablation method for forming a score in a wafer of semiconductor material is schematically illustrated. FIG. 1A is a cross-sectional view showing the forming (generally indicated with 1) of the score 4 in a wafer 2. The wafer 2 is made of a body of semiconductor material 5.

The top surface 6 of the wafer 2 is irradiated with a laser beam 3, while the wafer is moved relative to the laser beam 3 for forming the score 4. The semiconductor material 5 is partly molten, partly evaporated by the laser beam 3 and is blasted away from the location of impact 7 of the laser beam 3 on the wafer 2. The molten fraction of semiconductor material, also called slag, is partly deposited on the walls of the score 4, forming a recast layer 8. Other parts of the molten fraction (slag), are blasted away from the score in the form of debris 9, and are deposited with certain force on the top surface 6 of the wafer. A relatively large part of slag which is not completely ejected from the score 4, is deposited just outside and adjacent the score 4 on the top surface 6, forming a small ridge 10 adjacent the score 4.

While cooling down, the recast layer 8, the ridge 10 and the debris 9 resolidify and remain on the surface of the wafer.

Figure 1B:
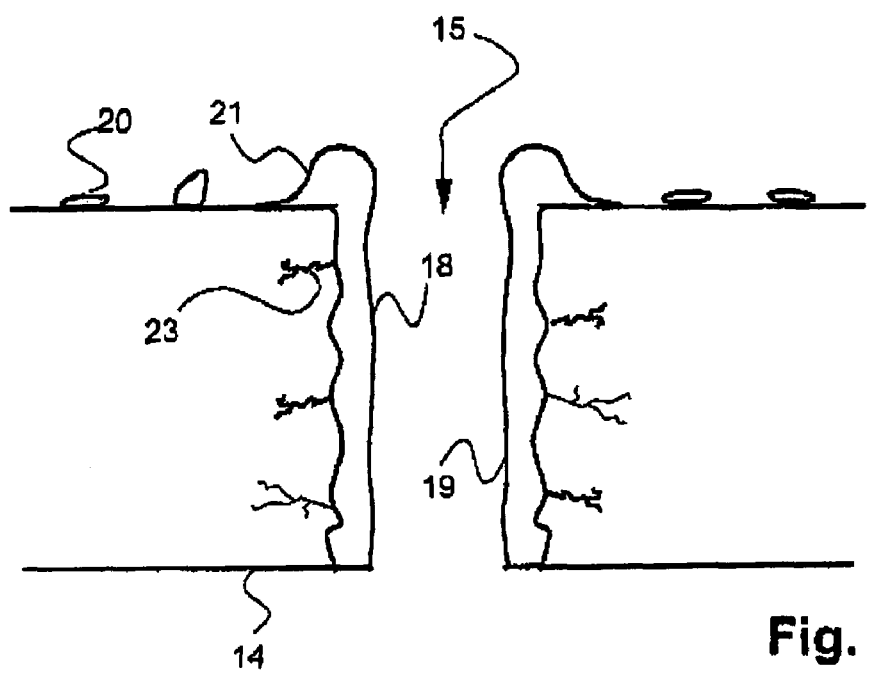

FIG. 1B schematically shows a wafer 14 which has been processed using a laser ablation method. A cut 15 has been formed in the wafer 14, and is shown in FIG. 1B, recast layers 18 en 19 are present on either side surface of the cut 15. Also, ridge 21 and debris 20 present on the top surface of wafer 14 are shown in FIG. 1B.

It has been experienced that laser dicing of wafers results in a weaker die strength of a single die. Especially for thin wafers, this is a critical issue. The reduced die strength is experienced as an increased chance of fracture, which may be encountered during handling of the die or the wafer. The reduced die strength can be measured by a test method consisting of mechanical bending the dies in a special arrangement, using four- and three point measurements.

The inventors of the present invention have discovered that the reduced die strength is caused by microcracks 23 and other defects formed near the interface between the recast layers 18 and 19 and the base material of wafer 14. This is schematically shown in FIG. 1B. Differences exist between the densities and structural arrangement of the recast layers 18 and 19, and the base material. For example, upon re-solidification of the recast layer, the slag forming the recast layer expands while it is cooling down, creating a difference in density and inducing stress in the recast layer and in the semiconductor material of the body of the wafer 14, causing these microcracks 23. The microcracks 23 extending into the semiconductor material, as well as other defects caused by the laser ablation method such as, for example, sharp tips, are sources for crack initiation and propagation in the die separated from the wafer 14. An increased amount of microcracks 23 and defects, therefore reduces the mechanical die strength and increases the chance of fractures of the die.

Figure 2:
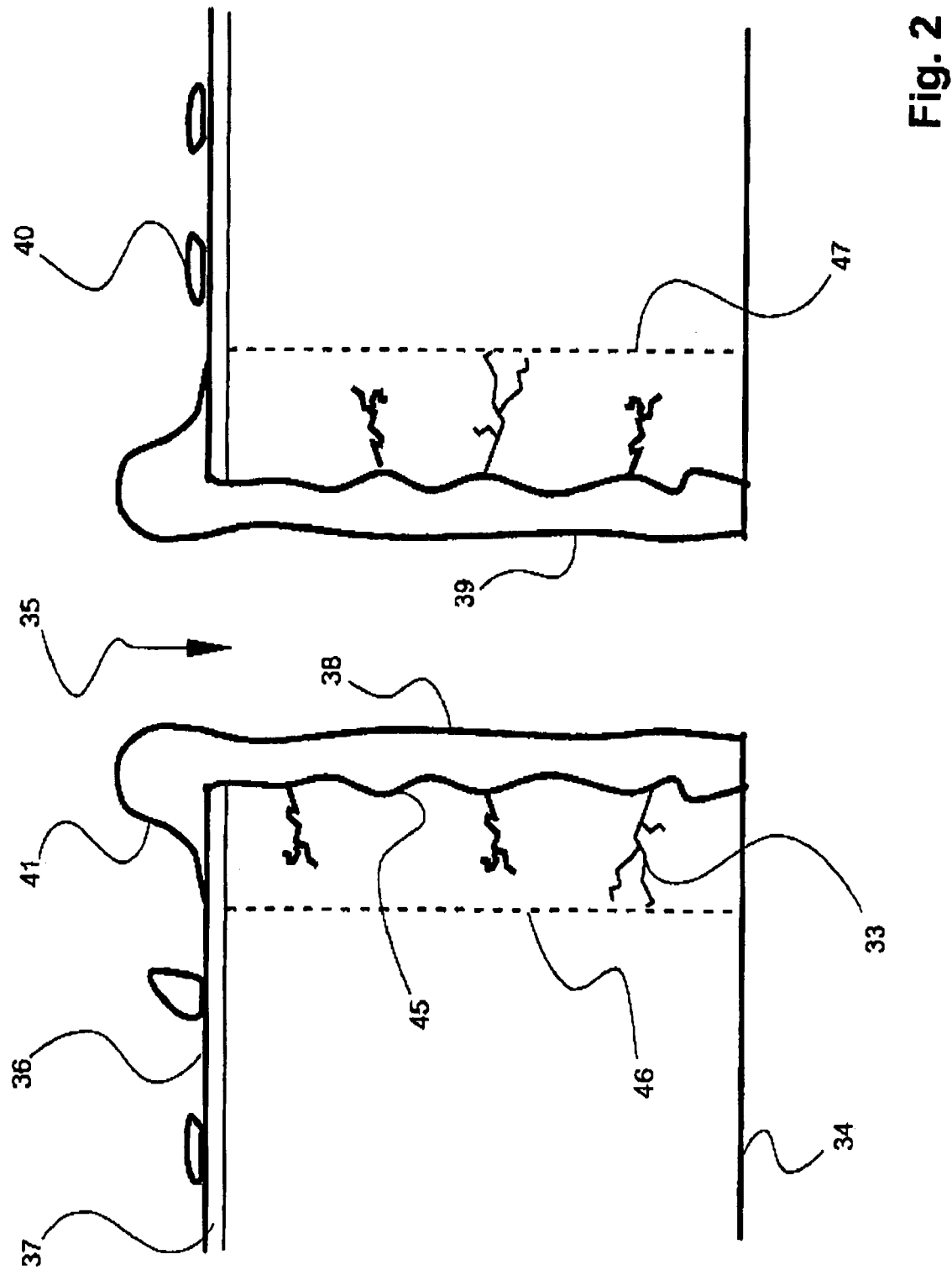
FIG. 2 is a schematic cross sectional view of a score in a wafer for explaining a treatment method of the present invention.

The method of the present invention is directed to improving the mechanical strength of the die or the wafer processed using the laser processing method, by removing the recast layer and at least a part of the semiconductor material. This is schematically illustrated in FIG. 2, which shows a wafer 34 comprises of semiconductor material, which has been processed using as laser ablation method, forming a cut 35 in the wafer. Both sides walls of the cut 35 are covered with a recast layer 38, 39 comprised of slag (resolidified semiconductor material). On the top surface 36 of the wafer 34, adjacent the cut 35, ridges such as ridge 41 are formed on either side of the cut 35. The ridge contains recast material or slag which has been blasted but not completely ejected from the cut and which has been deposited on the top surface 36 directly adjacent the cut. FIG. 2 further illustrates fractions of debris 40 deposited on the top surfaces 30 of the wafer 34, at some distance from the cut 35.

The microcracks such as micro crack 33, extending into the semiconductor material of the wafer 34, extend from the interface 45 between the recast layer and the semiconductor material, such as interface 45 between recast layer 36 and the semiconductor material of the wafer 34. These microcracks typically extend into the semiconductor material over a length within a range up to 10 μm. For example, for a silicon wafer and using focussed ion beam imaging (FIB), the inventors have discovered that some microcracks may run up to 7 μm through the recast layer and into the material. Analysis with a transmission electron microscope shows in this case that the thickness of the recast layer is about 3 to 4 µm. It should be noted that the problem of die strength deterioration is not confined to microcracks of the dimensions indicated above, but already a very small microcrack of 1 µm or less sufficient to reduce the die strength.

The method of the present invention is directed to the treatment of the wafer 34 by etching away the recast layer and at least a part of the semiconductor material of the wafer 34. The semiconductor material may be etched away over a few micrometers extending from the interface 45, as indicated by dotted lines 46 and 47. In the present example, the microcracks extending into base material of the wafer 34 are effectively removed, improving the die strength of the separated dies.

Optionally, and before the wafer 34 is being processed by the laser processing method, the wafer 34 may be coated using a protective coating 37. The protective coating 37 protects the semiconductor material near the upper side of the wafer 34, just below the top surface 36, from being affected by the edge process. The structure of the protective coating and the relative selectivity of the etch composition used for etching, can be chosen such that, dependent on the thickness of the protective coating 37 and the duration of the etch step, the protective coating 37 protects the semiconductor material 34 near the top side 36 of the wafer just long enough to carry out the etching process.

The step of etching is performed such that the recast layers 38 en 39, the ridge 41 the debris 40 and at least part of the semiconductor material of the wafer 34 are removed, preferably such that most or all of the microcracks (and other defects) near the interface 45 of the wafer 34 are disappeared. The depth over which the semiconductor material is etched, is indicated with dotted lines 46 and 47.

It is noted that FIG. 2 is a schematic drawing, and the dimensions and the ratios, may not reflect the dimensions and ratios between the dimensions in reality. The recast layers 38 and 39 may be much thicker, while the extend over which the semiconductor material of the wafer 34 is etched may be much smaller than as indicated by dotted lines 46 and 47.

Figure 3:
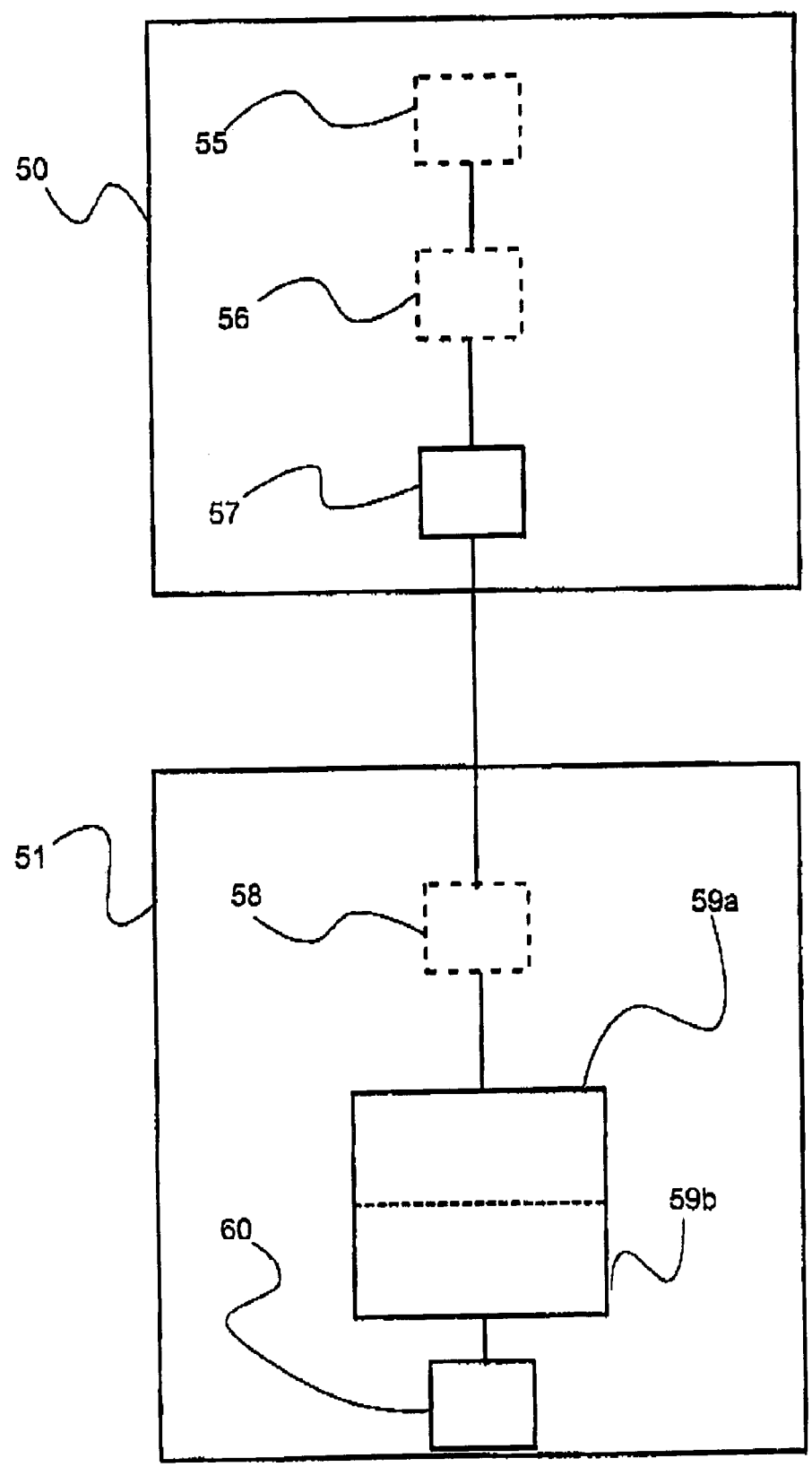
FIG. 3 is a schematic overview of the method of the present invention.

The method of the present invention is schematically illustrated in FIG. 3. Steps that are optional in the method of the present invention are indicated with dotted lines, such as steps 55, 56 and 58.

FIG. 3 schematically indicates the first step of laser ablation 50, followed by the second step of etching of the processed wafer or the separated semiconductor elements. The first step of laser ablation 50 may be performed by (optionally) mounting the wafer onto a tape with frame (step 55), prior to dicing of the wafer. The tape may be an adhesive tape, and the bottom side of the wafer will be placed onto the tape and adhere thereto. Tapes of this kind, including suitable frames, are known to the skilled person in the art.

A second optional step 56 comprises applying a protective coating on the surface of the wafer, such as protective coating 37 of wafer 34 in FIG. 2. The protective coating protects the semiconductor material of the wafer near the upper surface thereof during the etching step described hereinbelow, while any debris or slag deposited on the top side of the wafer will be exposed to the etching process, such that it may be removed.

In step 57, the wafer is processed using a laser beam. For example, a laser beam may be irradiated onto the wafer surface, and the wafer may be moved relative to the laser beam for forming a score or cut in the wafer. The method may be performed by moving the wafer relative to the laser beam in a first direction, and subsequently in a second direction, in order to separate semiconductor elements from the wafer. Most of the time, a matrix pattern of scores in two orthogonal directions would be formed on the wafer surface, although any pattern of scores is possible. Optionally in step 57, the laser beam used may be separated using a diffractive optical element into a plurality of secondary laser beams, following each other subsequently through the score formed by the first of the secondary laser beams. Such a method is for example described in U.S. Pat. No. 5,922,224, assigned to the assignee of the present application, and incorporated herein by reference.

The laser processing step 50 is completed with step 57, and the method carries on with the treatment step 51. The treatment step 51 may optionally include a step of cleaning of the processed wafer, prior to etching for removing at least a part of the debris and slag deposited on top of the wafer surface. This optional cleaning step is indicated with reference number 58 in FIG. 3.

After the optional cleaning step 58, the method is continued with the step of etching (59a en 59b). First the recast layer and the debris on the top surface of the wafer are removed during the etching step in substep 59a. After that, the etching step is continued with step 59b and at least a part of the semiconductor material of the wafer is removed in step 59b. It is noted that steps 59a en b are carried out in a single etching step, subsequently after each other. Steps 59a and 59b may be performed by continuing the step of etching for a sufficiently long duration of time using a suitable etching composition.

Different etch compositions may be used if the composition is optimized for the specific process step, both under alkaline and acidic conditions. For optimum die strength recovery or improvement, the etch composition is specially optimized for the system. Optimization properties include, but are not limited to, compatibility with the wafer material, relative selectivity, etch rates, underetching, final morphology, for example, polished or textured, and whether or not a processing combination is applicable with the tapes and the frames without damaging these. The composition and process properties are chosen such that the tape and frame properties are not adversely affected, and damage to the tape and frame does not occur. In addition, the occurrence of etch residual and/or adhesion is avoided.

As an example, when the treatment method of the invention is applied to a GaAs wafer with multiple layers, such as silicon nitride, epitaxial grown GaAs and AlGaAs, an alkaline etch such as the commonly known ammonia:hydrogenperoxide:water system can be used. For such a wafer, the composition has been optimized to, but is not limited to, $NH_4OH$: $H_2O_2$:$H_2O$ as in a volumetric ratio of 1.6:25:75. The relative selectivity GaAs/AlGaAs has been optimized to be around 60 for the epitaxial grown GaAs and AlGaAs. The process window is chosen such that the slag/recast is removed completely, and the base material is also partly etched. The underetching of the silicon nitride layer is under control and limited after the etch clean die strength optimization step. The die strength is restored or improved after the process step, indicating the removal of the microcracks and/or sharp tips which are fracture initiators under stress. Analysis to achieve or study this include fractography analysis and Weibull statistics to determine the characteristic strength and the Weibull parameter.

In addition to the above, the composition may be further optimized to obtain a good processing window, while retaining the desired selectivity and die strength recovery or improvement. For example, the etch composition used in the method described above for the GaAs wafer with multiple layers such as siliconnitride, epitaxial grown GaAs and AlGaAs, is optimized such that the process window is below the 2 minutes range, and can be tuned to any process window. This may be achieved with composition optimization and analysis with, for example, optical techniques or scanning electron microscopy (SEM).

It is noted that, in addition to the example described above regarding the alkaline system for GaAs wafers with multiple layers, a range of other compositions have been tested. For example, inside this range, results were acceptable for $NH_4OH:H_2O_2:H_2O$ compositions between 5:1:25 and 1.6:25:75, but the preferred composition, with regards to all the aforementioned qualities (underetching, die strength, time etc.) is the $NH_4OH:H_2O_2:H_2O$ as 1.6:25:75 etch composition. In case of acidic systems on the other hand, applied to the same type of wafers, several systems and settings have been tested. For example, a composition based on $HCl:H_2O_2:H_2O$ as 1:4:40 for GaAs material, resulted in reasonable properties after a minimum of 7.5 minutes of etching time. As another example, also a $H_3PO_4:H_2O_2:H_2O$ composition has been tested. Using a composition of $H_3PO_4:H_2O_2:H_2O$ as 1:2:16, resulted in reasonable properties after 6.5 minutes.

Other experiments have been performed with different types of wafers. Amongst these experiments, the method of the invention was successfully tested on Si wafers with $SiO_2$, using a $HNO_3:HF:H_2O$ system. For example, using a volumetric ratio of $HNO_3:HF$ as 64.810:0.146, full die strength recovery was complete after 75 minutes of etching. The skilled person will appreciate that volumetric ratios of this etch composition may be adjusted to improve the processing window considerably. It is further noted that a $HNO_3:HF:H_2O$ system may not be applicable in all situations. The $HNO_3:HF:H_2O$ system is detrimental to a lot of common metal contacts. Therefore, actual product wafer material may have a suitable protection layer or (sacrificial) etching layer, such as, for example, silicon nitride. Another possibility would be the use of a protective coating.

FIG. 4 schematically shows an arrangement for carrying out a method of the present invention. The arrangement consists of a laser processing apparatus 65 and an etching machine 66. The laser processing apparatus 65 is connected with the etching machine 66 by a conveyor belt 67, which transports carriages such as carriage 77 and carriage 78, upon which wafers, such as wafer 76 and wafer 79, are placed from the laser processing machine 65 to the etching machine 66 for carrying out the subsequent step of the present invention.

Laser processing apparatus 65 consists of a laser 69 for generating a strong primary laser beam 70. Laser 69 may be a pulsed YAG laser. The laser beam 70 impinges on the diffractive optical element 73, which separates the primary laser beam 70 into a plurality of secondary laser beams 74. The plurality of secondary laser beams 74 are refocused by focussing means such as lens 75 onto the surface of wafer 76. The wafer 76 is carried on a carriage 77 that may comprise a framed adhesive tape (not shown) for carrying the wafer. The carriage 77, during the laser processing step, is carried on support means 80. Support means 80 are arranged for moving the wafer 76 relative to the laser beam 70 in a plurality of directions, for forming the desired scores or cuts in the wafer 76. The description of a similar arrangement is described in U.S. Pat. No. 5,922,224.

After being processed in the laser processing apparatus 65, pushing means 83 push the carriage 77 onto conveyor belt 67 using pushing arm 84. Conveyor belt 67 moves the carriage 77 towards the etching machine 66. Note that in FIG. 4, etching machine 66 is presently processing wafer 79 on carriage 78. Operation of etching machine 66 may be as described below. An alternative solution would make use of a robot arm (not shown), picking up carriage 77 from later processing apparatus 65, and placing it in etching machine 66.

Etching machine 66 consists of a rotary table 85 onto which carriages such as carriage 78 are placed when the etching machine is in operation. Carriage 78 carries wafer 79, and wafer 79 is placed such that the midpoint of wafer 79 is placed opposite and underneath droplet generator 88. Droplet generator 88 is connected to reservoir 89, which reservoir contains the etching composition used in the method of the present invention. Rotary table 85 starts spinning at a relatively low rotational speed, such that the wafer 79 describes the rotary movement underneath the droplet generator 88. Droplet generator 88 starts generating droplets 90 comprised of the etching composition, which droplets impinge on the top surface of wafer 79.

As a result of the rotary movement of the wafer 79, the centrifugal force on the liquid etching composition present on the surface 79 causes the etching composition to spread equally over the surface of the wafer 79. The etching composition reacts with the semiconductor material in the recast layer and in the body of the wafer 79, removing the debris, the recast layer and at least part of the semiconductor of the body of the wafer. Optionally, the wafer 79 may be coated with a protective coating, such that the top surface of the wafer 79 is not affected by the etch composition.

After the etch composition has operated on the wafer sufficiently long, the wafer may be washed using nozzles 93 and 94 connected to reservoirs 95 and 96 containing demineralized water. After washing the wafer 79 with demineralized water, the process is completed.

Note that the etching machine 66 may be operated as a stand-alone machine, independent from laser processing apparatus 65 and conveyor belt 67. This is also valid for the etching process steps 51 illustrated in FIG. 3.

For the purpose of comprehensiveness, it is noted here that numerous modifications and variations of the present invention are possible in the light of the above teachings. It is therefore understood that, within the scope of the appended claims, the invention may be practiced otherwise then as specifically described herein.

The invention claimed is:

1. A method of treating a substrate comprising a body of semiconductor material processed with a laser beam, comprising:

removing from the semiconductor material recast material deposited on said substrate during said laser processing, and at least a part of said body of semiconductor material contiguous to an area processed with a laser beam;

wherein the removing of said recast material and said part of said contiguous body of semiconductor material comprises an etching, the etching is controlled to remove both the recast material and a depth of said contiguous semiconductor material, and said etching control is optimally performed to a depth of the contiguous semiconductor material to remove microcracks formed due to laser processing, resulting in an improvement of mechanical strength of said substrate.

2. The method according to claim 1, wherein said substrate comprises a score or cut formed during said laser processing.

3. The method according to claim 1, wherein semiconductor material removed is within a range of at most 10 µm from an exterior surface of said body of semiconductor material, as measured prior to said etching.

4. The method according to claim 1, wherein the etching is controlled by performing the etching for a duration of time which is optimized for removing said recast material and said part of said semiconductor material.

5. The method according to claim 1, wherein said semiconductor material comprises at least one member of the group consisting of Si-based semiconductors, In-based semiconductors, Ge-based semiconductors, semi conductors comprising elements selected from group III of the periodic table and elements selected from group V of the periodic table, semiconductors comprising elements selected from group II of the periodic table and elements selected from group IV of the periodic table, semiconductors comprising elements selected from group III of the periodic table and nitride.

6. The method according to claim 1, wherein the etching is performed using an etch composition comprising at least one selected from the group consisting of $NH_4OH$, $H_2O_2$, HCl, $H_3PO_4$, $HNO_3$, HF, NaOH, KOH, NaOCl, KOCl, $HClO_4$, $H_2SO_4$, $(CH_3)_4NOH$ (tetramethyl ammonium hydroxide (TMAH)), HBr, $K_2Cr_2O_7$, $C_6H_8O_7$, $HOOCCH_2CH_2COOH$ (succinic acid), $Br_2$, organic amines, $NH_4F$, solvents and compositions of the above.

7. The method according to claim 6, wherein said etch composition comprises $NH_4OH:H_2O_2:H_2O$ in a ratio of a:b:c by volume, wherein a is in a range of 0.4 to 20, b is in a range of 1 to 40, and c is in a range of 10 to 100.

8. The method according to claim 7, wherein said etch composition comprises $NH_4OH:H_2O_2:H_2O$ in a ratio of 1.6:25:75 by volume.

9. The method according to claim 1, further comprising cleaning of said substrate for removing debris from said substrate.

10. The method according to claim 9, wherein said cleaning of said substrate is performed prior to said etching of said substrate.

11. The method according to claim 1, wherein said etching is controlled for removing debris from said substrate.

12. The method according to claim 1, wherein said substrate further comprises a protective coating, and wherein said step of etching is further controlled for removing said protective coating from said substrate.

13. The method according to claim 1, wherein said processing of said substrate prior to said treating of said substrate comprises at least one selected from the group consisting of scribing, laser cutting, laser dicing, and forming of said substrate using a laser cutting or laser dicing process.

14. The method according to claim 1, wherein said substrate is selected from the group consisting of a wafer, a semiconductor element separated from a wafer, a diode, a transistor, and an operational amplifier.

15. A method of processing a substrate using a laser beam comprising a treatment method according to claim 1, wherein said substrate comprises at least a body of semiconductor material.

16. The method according to claim 15, wherein said substrate is a wafer of semiconductor material.

17. The method according to claim 15, wherein said method comprises a step of scribing said substrate using said laser beam for forming a score on said substrate.

18. The method according to claim 17, wherein said substrate is diced by said laser for separating semiconductor elements from said substrate.

19. The method according to claim 15, wherein prior to said step of processing said substrate, said substrate is mounted on an adhesive tape.

20. The method according to claim 19, wherein said tape is fixed on a frame.

21. A semiconductor element manufactured using a method according to claim 15.

22. An arrangement for performing a method according to claim 15, comprising means for providing a laser beam for processing a substrate of semiconductor material, and means for etching said substrate after processing thereof with said laser beam, wherein said means for etching are arranged for controlling said etching for removing recast material from said substrate and for removing a depth of contiguous semiconductor material of said substrate such that microcracks formed due to laser processing are removed.

23. The method according to claim 5 wherein said semiconductor material comprises at least one selected from the group consisting of GaAs, AlAs, InAs, GaP, AlP, InP, GaSb, AlSb, InSb, InGaAs, AlGaAs, ZnO, ZnS, ZnSe, ZnTe, CdO, CdS, CdSe, CdTe, HgO, HgS, HgSe, HgTe, AlN, GaN, InN, SiGe, SiC, sapphire, and compositions thereof.

24. The process according to claim 6, wherein the etching is performed using ethylene diamine and pyrocathechol.

* * * * *